(12) United States Patent
Raby et al.

(10) Patent No.: US 7,116,557 B1
(45) Date of Patent: Oct. 3, 2006

(54) IMBEDDED COMPONENT INTEGRATED CIRCUIT ASSEMBLY AND METHOD OF MAKING SAME

(75) Inventors: Jim D. Raby, Madison, AL (US); Mark T. McMeen, Huntsville, AL (US); Jason B. Gjesvold, Harvest, AL (US); Casey L. Hatcher, Madison, AL (US)

(73) Assignee: STI Electronics, Inc., Madison, AL (US)

( * ) Notice: Subject to any disclaimer, the term of this patent is extended or adjusted under 35 U.S.C. 154(b) by 55 days.

(21) Appl. No.: 10/444,684

(22) Filed: May 23, 2003

(51) Int. Cl.
*H05K 7/20* (2006.01)

(52) U.S. Cl. .................. 361/720; 361/704; 361/719; 257/710; 257/712; 29/841

(58) Field of Classification Search ........ 361/702–712, 361/761–764, 792–795, 717–719, 777–778, 361/679, 732–734; 257/706–729, 670, 691, 257/697, 692, 622, 762, 773; 174/16.3, 252, 174/260, 261, 52.2, 52.4; 165/80.2, 80.3, 165/80.4, 185; 438/127, 211, 219, 126
See application file for complete search history.

(56) References Cited

U.S. PATENT DOCUMENTS

| | | | | |
|---|---|---|---|---|
| 4,922,324 A * | 5/1990 | Sudo | ......................... | 257/700 |
| 5,227,583 A * | 7/1993 | Jones | ......................... | 174/52.4 |
| 5,235,208 A * | 8/1993 | Katoh | ......................... | 257/691 |
| 5,405,808 A * | 4/1995 | Rostoker et al. | ............. | 29/841 |
| 5,455,465 A * | 10/1995 | House | ......................... | 307/69 |
| 5,583,378 A * | 12/1996 | Marrs et al. | ................. | 257/710 |
| 5,622,898 A * | 4/1997 | Zechman | ..................... | 438/127 |
| 5,656,830 A * | 8/1997 | Zechman | ..................... | 257/784 |
| 5,796,165 A * | 8/1998 | Yoshikawa et al. | ......... | 257/728 |
| 5,814,883 A * | 9/1998 | Sawai et al. | ................. | 257/712 |
| 6,081,426 A * | 6/2000 | Takeda et al. | ............... | 361/704 |
| 6,359,234 B1 * | 3/2002 | Kouda | ......................... | 174/260 |
| 6,362,964 B1 * | 3/2002 | Dubhashi et al. | ........... | 361/707 |
| 6,380,631 B1 * | 4/2002 | Mess et al. | ................. | 257/777 |
| 6,395,582 B1 * | 5/2002 | Sohn et al. | ................. | 438/111 |
| 6,440,770 B1 * | 8/2002 | Banerjee et al. | ............ | 438/106 |
| 6,500,760 B1 * | 12/2002 | Peterson et al. | ............ | 438/684 |
| 6,501,168 B1 * | 12/2002 | Castro et al. | ............... | 257/700 |
| 6,573,124 B1 * | 6/2003 | Chou et al. | ................. | 438/126 |
| 6,743,975 B1 * | 6/2004 | Kolb | ......................... | 174/35 R |

* cited by examiner

*Primary Examiner*—Michael Datskovskiy
(74) *Attorney, Agent, or Firm*—Waddey and Patterson, PC; Howard H. Bayless

(57) ABSTRACT

Integrated circuit components are imbedded within a laminate substrate disposed on a thermally conductive core, which provides a thermal sink. The circuit components are electrically connected to the integrated circuit via flexible electrical interconnects such as flexible wire bonds. An electrically insulating coating, is deposited upon the flexible electrical interconnects and upon the exposed surfaces of the integrated circuit assembly. The coating provides rigidity, an electrically insulating barrier and a first environmental barrier for preventing contamination of the exposed surfaces of the integrated circuit assembly. A thermally conductive encapsulating material, such as silicon gel, encases the circuit components and the flexible electrical interconnects within a rigid or semi-rigid matrix. The encapsulating material provides additional mechanical support, a second environmental and a thermal sink for dissipation of heat.

17 Claims, 10 Drawing Sheets

IMBEDDED COMPONENT INTEGRATED CIRCUIT ASSEMBLY AND METHOD OF MAKING SAME

BACKGROUND OF THE INVENTION

The present invention relates generally to printed circuit boards and circuit assemblies having imbedded components. Imbedded components are herein defined as active and passive electrical devices, both in packaged and unpackaged states, wherein the devices are placed within cavities of a laminated circuit board. Examples of components that may be imbedded are: bare die, chips, thick or thin film devices and all constructed devices, including crystals, oscillators and wire wound devices. More particularly, this invention pertains to coated and encapsulated printed circuit boards having imbedded components. Even more particularly, this invention pertains to coated and encapsulated printed circuit boards having imbedded components and imbedded thermal cores.

The emergence of the application of multi-layer laminates in printed circuit board design has placed much more emphasis on printed circuit board reliability. Printed circuit board operational stress factors affecting reliability include internal operating conditions including overall and component level power generation and heat dissipation and environmental factors like thermal cycle, mechanical shock, vibration, humidity and contaminants. This emphasis has been compounded by the direction of the industry to fabricate smaller, denser printed circuit board packages, especially for use in mobile platforms such as cell phones, vehicles and airframes. For example, use of printed circuit board in avionics requires such boards be designed and constructed so as to minimize volume and mass, to operate in conditions of significant vibration and high G-forces, and to withstand conditions of widely varying pressure, temperature and humidity. Incorporation of high speed processors requires compatible integrated circuit speeds and signal densities.

Conventional printed circuit board designs can not optimally meet these design goals. Conventional printed circuit board design frequently employs surface mount and through-hole mount technologies to physically secure and electrically connect circuit components to the integrated circuit imbedded in the laminate substrate. Surface mounting methods and through-hole mounting methods include the use of substantial packaging interconnects having one or more series of electrical interconnects. Typical of this technology are semiconductor dies attached to a leadframe and encased in molded plastic body, wherein the leadframe is soldered to the printed circuit board. The leadframe and the molded plastic body add to circuit board weight, height and volume. The leadframe also adds to overall circuit resistance and self impedance. The large size of leadframe connections limits the I/O density of the circuit.

More recently, die packaging technology has incorporated technologies such as flip chip design, wherein solder spheres directly connect a semiconductor die to a circuit bonding pad. Ball grid arrays have reduced the interconnect length and the number of packaging interconnects. However, there have been unanticipated limitations with this technology when exposed to environmental stresses. The solder spheres tend to concentrate shock, vibrational stress and thermal stress and frequently fail during or following exposure to such operating conditions. These limitations are particularly prevalent in printed circuit boards used in portable systems such as cell phones, radios, and avionics.

What is needed, then, is a printed circuit board assembly which has: reduced mass and volume as compared to conventional standard circuit boards; higher circuit I/O densities; improved shock loading, vibrational and thermal stress performance, improved thermal management, and multiple levels of environmental protection and electrical insulation.

SUMMARY OF THE INVENTION

In one embodiment of the Imbedded Component Integrated Circuit Assembly of the present invention, an integrated circuit component is imbedded within a cavity formed from the tiered surfaces of truncated substrate layers of an organic laminate substrate. The laminate substrate is disposed on a thermally conductive core and an integrated circuit is disposed within the substrate layers. The imbedded components are attached to the floor of the cavity, which is in thermal communication with the core. The core provides a thermal sink for dissipation of heat from the electronic components. The circuit components are electrically connected to the integrated circuit via flexible or rigid electrical interconnects such as flexible wire bonds or electrically conductive epoxies. A coating material, such as parylene, is deposited upon flexible electrical interconnects, any exposed electrical surfaces, and the exposed surfaces of the integrated circuit assembly. The coating provides rigidity to the flexible electrical interconnects, increasing their strength and performance during vibration and shock loading. The coating provides an electrically insulative barrier for the exposed electrical surfaces and a first environmental barrier preventing contamination of the exposed surfaces of the integrated circuit assembly. A thermally conductive encapsulating material, such as silicon gel, is applied within the cavity to encase the circuit component and the flexible electrical interconnects within a rigid or semi-rigid matrix providing additional mechanical support. The encapsulant also provides a second environmental barrier for preventing contamination by humidity or chemical contaminants. Additionally, the encapsulating material provides a thermal sink for dissipation of heat from the electrical components to other thermal sinks such as the primary core or the laminate substrate.

Accordingly, it is an object of the present invention to provide an improved integrated circuit assembly having imbedded components within the laminate substrate so as to provide greater environmental control and protection.

Another object of the invention is the provision of multiple levels of environmental protection through the application of coating and encapsulating materials.

An additional object of the invention is to reduce the overall mass and volume of the integrated circuit assembly.

An additional object of the invention is to reduce the number and length of electrical interconnects between the circuit components and the integrated circuit.

An additional object of the invention is to provide for improved thermal management to reduce peak temperature in the components within the circuit board assembly.

Yet another object of the invention is to reduce the flexion of the integrated circuit assembly and provide for a more even distribution of stresses acting upon the electrical interconnects during thermal cycles and high shock loading and vibration conditions.

DESCRIPTION OF THE PREFERRED EMBODIMENTS

Figure 1:
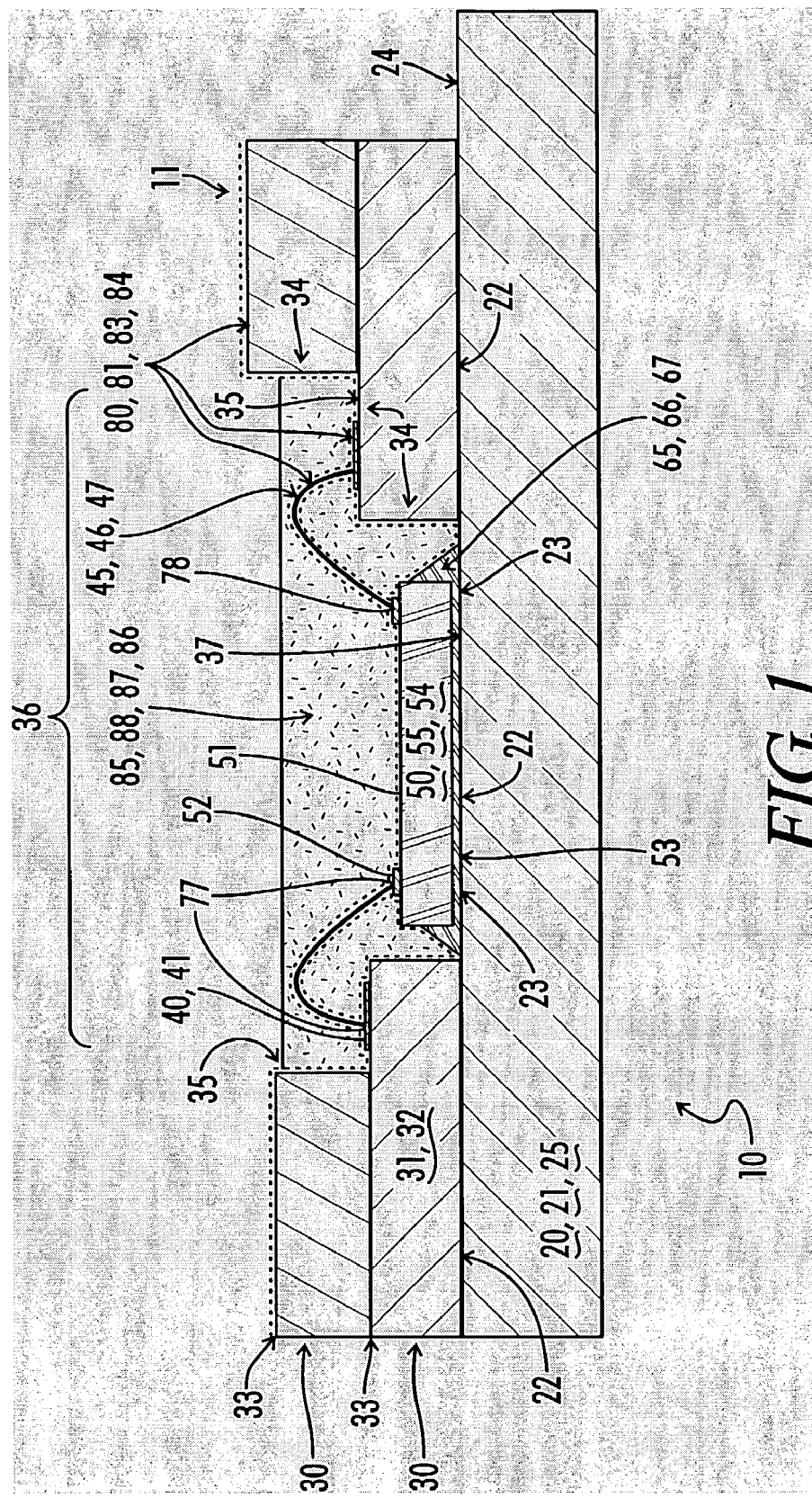
FIG. 1 is a sectioned view of a coated and encapsulated circuit component imbedded in the laminate substrate of a printed circuit board having a thermally conductive core in accordance with the present invention.

Referring now to FIG. 1, an integrated circuit assembly is constructed in accordance with the present invention is shown and generally designated by the numeral 10. The integrated circuit assembly 10 is shown having a primary core 20 composed of a thermally conductive material 21. The primary core 20 has a primary core surface 22. The primary core surface 22 is shown having a thermal sink surface 23 and a thermal dissipation surface 24. In this embodiment, the primary core 20 is a rigid plate 25 which serves as a structural basis for the integrated circuit assembly.

The integrated circuit assembly 10 is shown having a circuit component assembly 11 comprising a laminate substrate 30, a circuit 40 disposed within the laminate substrate 30, and a circuit component 50 disposed within a cavity 36 of the laminate substrate 30. The laminate substrate 30 of this embodiment of the invention is composed of an organic laminate material 31 formed in substrate layers 32, each substrate layer 32 having a top surface 33. The truncated ends of the laminate substrate layers are termed substrate tiers 34 and each substrate tier 34 has a substrate tier surface 35. The substrate tier surface 35 and the cavity floor surface 37 define the cavity 36 formed within the laminate substrate 30. In this embodiment of the present invention, the cavity floor surface 37 is comprised of at least a portion of the thermal sink surface 23 of the primary core 20.

A circuit component 50 is disposed on the cavity floor surface 37. The circuit component 50 is shown having electrically conductive component bonding pads 52 on a component bonding surface 51. In this embodiment of the invention, the circuit component 50 is an active component 54, in particular a semiconductor die 55. In an alternate embodiment, active component is a diode or a transistor. In another alternate embodiment of this invention, the circuit component is a passive component, such as a resistor, capacitor, transformer, switch, or inductor.

Referring again to FIG. 1, the circuit 40 disposed within the laminate substrate 30 is shown having an electrically conductive circuit bond pads 41 disposed on those substrate tier surfaces 35 that define the cavity 36. Electrical interconnects 45 are used to connect the component bond pad 52 with the circuit bond pad 41. In this embodiment of the present invention, the electrical interconnects 45 are comprised of at least one flexible electrical interconnect 46. In particular, the flexible electrical interconnects 46 are flexible wire bonds 47.

FIG. 1 further shows a conformal coating 80 deposited upon the electrical interconnects 45 and upon any exposed electrical surfaces, such as any exposed portion of the circuit imbedded in the substrate and any exposed portion of the electrical surface of the circuit component. Additionally, the conformal coating 80 is deposited upon all exposed surfaces of the integrated circuit assembly 10. In this embodiment, the conformal coating 80 comprises conformal subcoatings 81. The conformal coating 80 provides rigidity to the flexible electrical interconnects, increasing their strength and performance during vibration and shock loading. The conformal coating 80 also provides an electrically insulative barrier for exposed electrical surfaces and a first environmental barrier 84 preventing contamination of the exposed surfaces of the integrated circuit assembly 10. In this embodiment, parylene 83 was selected as a suitable coating material 80.

FIG. 1 also shows an encapsulating material 85 deposited in an vibration damping matrix 86 that encapsulates the circuit component 50 and the flexible electrical interconnects 46. Additionally, the encapsulating material 85 forms a second environmental barrier 87 preventing contamination of the circuit component 50, the electrical interconnects 45 and the surface of the cavity 36. In this embodiment, silicone gel 88 was selected as a suitable encapsulating material 85.

The integrated circuit assembly 10 of the embodiment shown in FIG. 1 has several advantages over the prior art. The circuit component 50 is imbedded in a cavity 36 disposed in the laminate substrate 30. This feature provides additional environmental protection, increased mechanical strength, and improved reliability as regards vibration and shock-loading performance. Additionally, use of flexible wire bonds 47 as electrical interconnects 45 have the advantage of providing flexibility and even distribution of stresses. Other advantages of wire-bonded components are a reduction in mass, elimination of die packaging and, also, a possible decrease in signal path and number of electrical bonding connections required. This increases the electrical performance of the integrated circuit assembly by reducing the self-inductance of the circuit paths and reducing the cumulative electrical resistance of bonding connections through reduction of the number of bonding connections The thermally conductive primary core 20 adds to the mechanical strength of the assembly and to the dissipation of heat. Metallic materials such as gold, gold alloys, copper, copper alloys, aluminum, aluminum alloys, nickel-gold alloys, palladium-silver alloys, bronze, metallic-laminate composite materials, carbon fiber laminate, carbon filled laminate and silver-loaded laminate composites, or combinations thereof, provide alternate selections for the thermally conductive material comprising the primary core 20.

In environment having significant vibration or shock-loading, it is desirable to have the structural rigidity of a primary core 20 comprising a rigid plate 25. The selection of thermally conductive material suitable for a rigid plate includes gold, gold alloys, copper, copper alloys, aluminum, aluminum alloys, nickel-gold alloys, palladium-silver alloys, bronze, metallic-laminate composite materials, carbon fiber laminate, carbon filled laminate and silver-loaded laminate composites, or combinations thereof. The advantages of a rigid plate would include reduction in the flexing of the circuit board under conditions of vibration and shock loading. Additionally, the use of a metallic rigid plate improves the overall mechanical strength of the integrated circuit assembly. In the embodiment shown in FIG. 1, the plate 25 has an average thickness of between 0.001 inches and 0.5 inches.

As stated above, the embodiment of the present invention incorporates parylene as a coating material and silicone gel as an encapsulating material. The conformal coating of the present embodiment has an average thickness of between 0.00025 inches and 0.003 inches as deposited upon the flexible wire bond 47 and the remaining surfaces of the remaining exposed surfaces of the integrated circuit assembly 10. Parylene material is vapor deposited in conformal sub-coatings 81. Each sub-coating has an average thickness of between 0.00025 inches and 0.150 inch. Multiple coatings or sub-coatings of the apparatus are shown in FIG. 1. Alternate embodiments of the invention of FIG. 1 employ various coating materials. Suitable materials would include parylene, silicone gel, urethanes, epoxies, acrylics or fluroaliphatic polymers. The selection of silicone gel 88 as encapsulating material 85 in this embodiment adds to the strength, reliability and environmental protection over what would be achieved without encapsulation. In addition, the silicone gel has thermal conductivity properties that allow it to dissipate heat from its source in the circuit component 50 to the laminate substrate 30, the environment if there is no ceiling structure above the cavity, and the cavity floor surface 37 not covered by the imbedded circuit component 50.

Alternate embodiments of the present invention of FIG. 1 employ alternate encapsulating materials. Suitable encapsulating materials include silicone gels, urethanes, epoxies, acrylics, fluroaliphatic polymers and parylene.

Referring again to FIG. 1, the embodiment of the present invention additionally shows the use of an adhesive material 65 to bond the circuit component 50 to the cavity floor surface 37. In this current embodiment, the adhesive material is a thermally conductive adhesive material 66 specifically thermally conductive epoxy 67. Alternate embodiments of the invention of FIG. 1 employ different thermally conductive adhesive materials. Suitable materials include thermally conductive epoxies, thermally conductive solder alloys, thermally conductive tapes or thermally conductive preformed material known as preforms.

One important aspect of the present invention is the strength and durability of the electrical interconnects. FIG. 1 shows an embodiment of the present invention having a flexible electrical interconnect 46 comprised of a flexible wire bond 47. The flexible wire bond 47 of this embodiment is an alloy of aluminum. FIG. 1 shows an embodiment of this invention having an ultrasonic wedge bond 77 as the connection between the flexible wire bond 47 and the electrically conductive component bond pad 52 or the electrically conductive circuit bond pad 41. Suitable materials for the flexible wire bond 47 suitable for ultrasonic wedge bonding include wires composed of aluminum, or aluminum alloy. The flexible wire bond 47 may be either a round wire bond having an average diameter of between 0.0005 inches and 0.020 inches. An alternative configuration of the flexible wire bond 47 is a ribbon wire bond covering an average width of between 0.005 inches and 0.025 inches and having an average thickness of between 0.001 inches and 0.006 inches. An alternative embodiment employs a thermosonic wedge bond as a wedge bonding connection. Suitable materials for the flexible wire bond 47 suitable for thermosonic wedge bonding include wires composed of gold, gold alloy, copper or copper alloy. Dimensions of the flexible wire bond 47 suitable for ultrasonic wedge bonding are also suitable for thermosonic wedge bonding.

FIG. 1 additionally shows a thermosonic ball bond 78 joining the flexible wire bond 47 with either an electrically conductive circuit bond pad 41 or the electrically conductive component bond pad 52. Suitable materials for the flexible wire bond 47 suitable for thermosonic ball bonding include wires composed of gold, gold alloy, copper or copper alloy. Thermocompression ball bonding may be employed as an alternative ball bonding connection. An alternative embodiment employs a thermocompression ball bond as a ball bonding connection. Suitable materials for the flexible wire bond 47 suitable for thermocompression ball bonding include wires composed of gold and gold alloy. Suitable dimensions of the flexible wire bond 47 suitable for ultrasonic wedge bonding are also suitable for thermosonic ball bonding and thermocompression ball bonding.

Precise location and volume dispensing of the thermally conductive adhesive 66 allows placement of the circuit component 50 in a cavity 36 having very small tolerances. In the embodiment of the present invention shown in FIG. 1, cavity 36 oversize dimensions as small as 0.005 inches have been achieved. The result is that the average length of the flexible wire bond 47 in the embodiment of FIG. 1 is between 0.010 inches and 1.000 inches. For most applications of the embodiment of FIG. 1, the average length of the flexible wire bond 47 is between 0.010 inches and 0.050 inches. Embodiments of the invention, according to FIG. 1, have been built utilizing thermosonic ball bonding of a 0.00125 inch diameter gold wire bond 47 and, alternatively, ultrasonic wedge bonding has been utilized in welding a 0.0012 inch diameter aluminum alloy wire.

In manufacture and testing of embodiments of the present invention shown in FIG. 1, common wire bond advantages shown are a higher circuit density achievable by the more precise placement of the wire bonds and an ability to increase the density of the circuit bond pads 41 along the available substrate tier surfaces 35. This allows for higher integrated circuit signal densities. Additionally, wire bonding has the advantage that it is a mature and robust technology with current commercial electronic applications and the ease of ability to integrate into the current invention.

It is understood that alternative embodiments of the invention of FIG. 1 include electrical interconnects comprises electrical packaging interconnects selected from the group solder spheres, solder columns, pin interconnects, solder alloy interconnects, conductive preformed interconnects, lead frames, or electrically conductive adhesives. It is further understood that the embodiment of FIG. 1 can be repeated on the opposite side of the primary core to produce a double sided integrated circuit practicing this invention.

Figure 2:
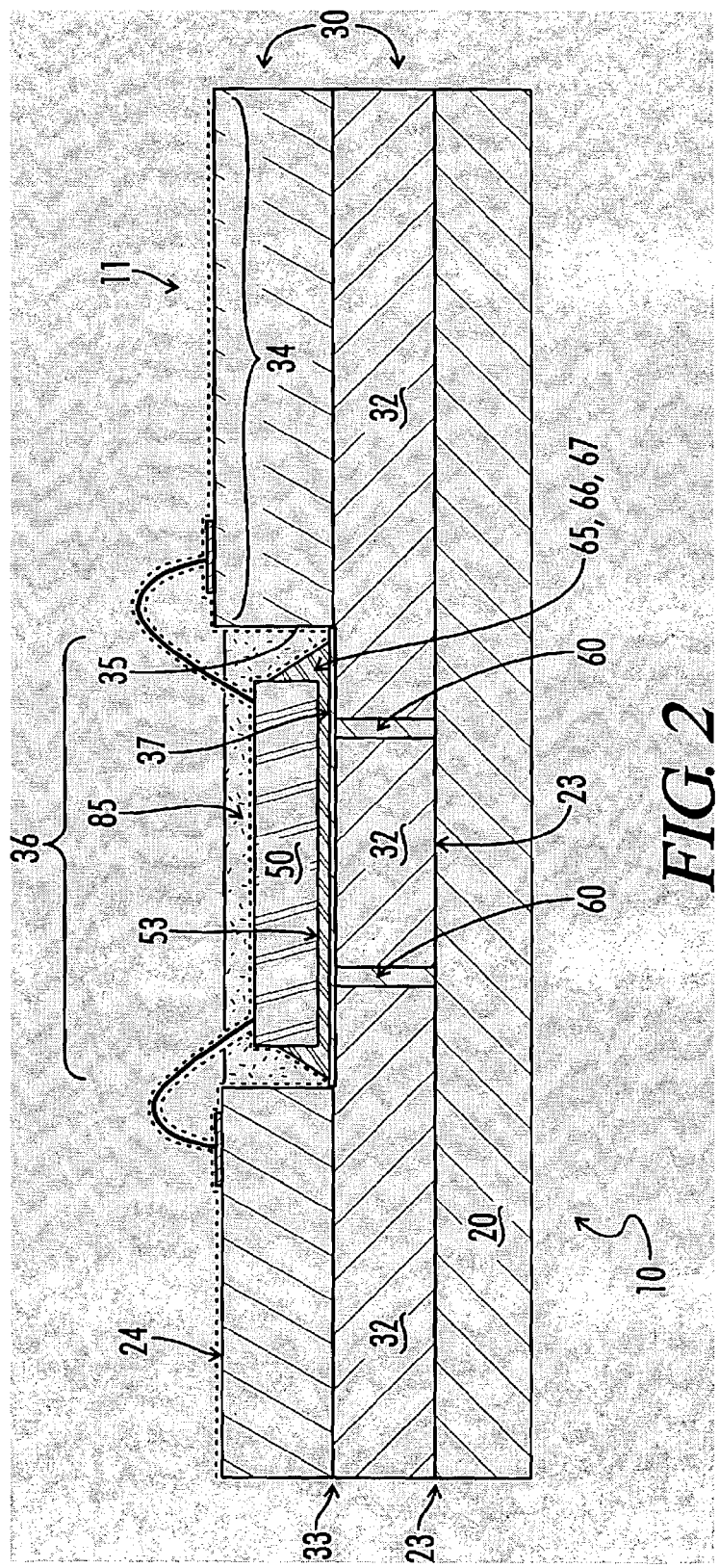
FIG. 2 is a sectioned view of an alternate embodiment of the invention of FIG. 1 having, additionally, a second core and a thermal via.

Referring now to FIG. 2, an embodiment of the current invention is shown having the cavity floor surface 37 removed from the thermal sink surface 23 of the primary core 20. A first substrate layer 32 is shown separating the cavity 36 and cavity floor 37 from the primary core 20.

Thermal management in this embodiment is achieved by the use of thermal vias 60 to provide a path thermally connecting the primary core 20 and the cavity floor surface 37. In this embodiment heat generated by the circuit component 50 is transmitted through the thermal source surface 53, through the thermally conductive adhesive material 66, through the adjacent cavity floor surface 37, along the thermal vias 60, and through the thermal sink surface 23 to the primary core 20. Additionally, heat generated by the circuit component 50 may also be transferred through the encapsulating material 85 to the laminate substrate 30 via the substrate tier surfaces 35.

The thermal vias 60 are constructed of inserts or depositions of thermally conductive materials including such suitable materials as gold, gold alloys, copper, copper alloys, aluminum, aluminum alloys, phosphor bronze, silver loaded epoxies, leaded or unleaded solders, and carbon filled materials. These materials were selected for their thermal characteristics and stability within a laminate structure as well as for their ability to be used for other functional elements, such as for ground planes and for electrical paths.

Figure 3:
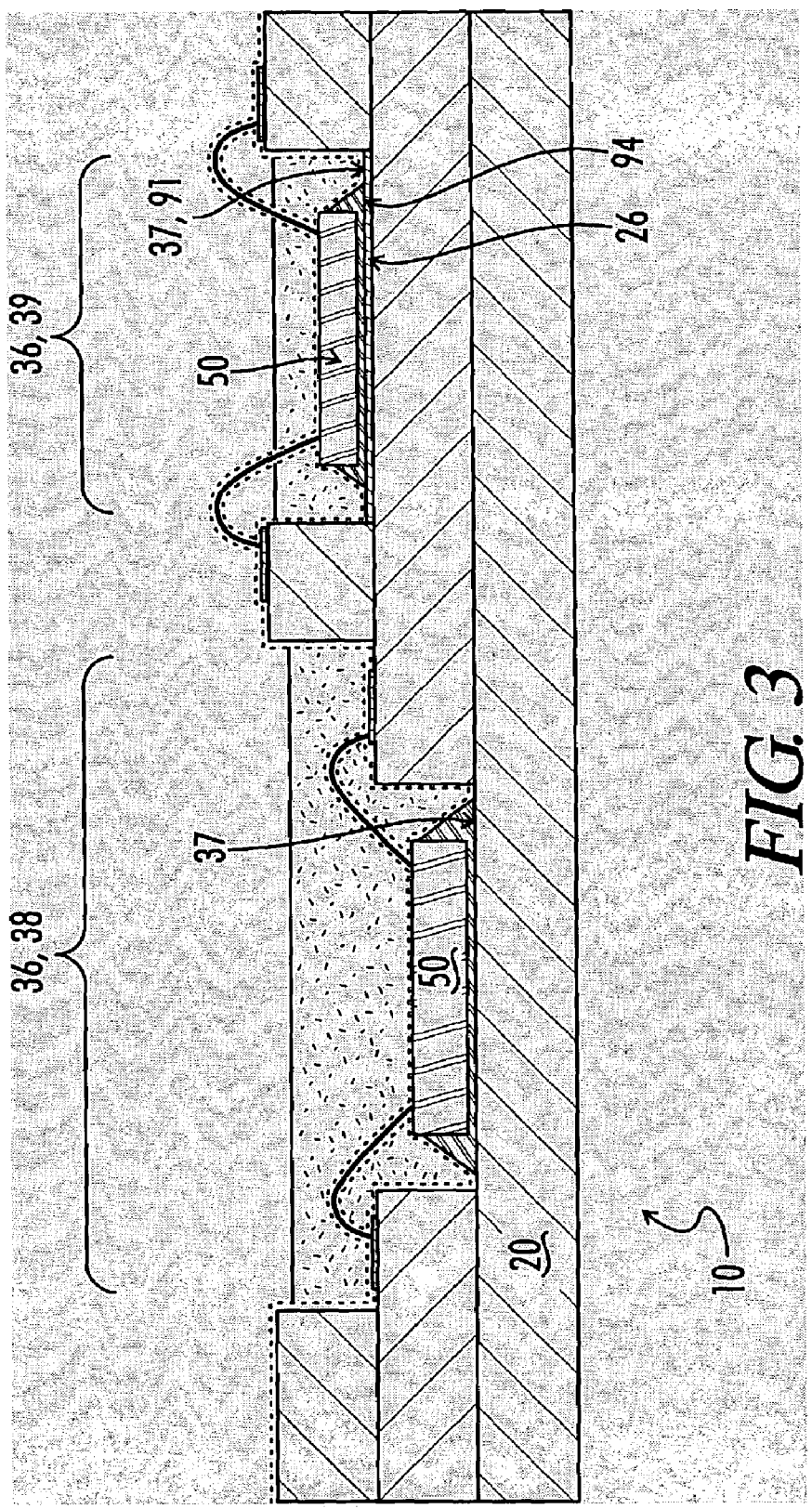
FIG. 3 is a sectioned view of an alternate embodiment of the invention of FIG. 1 having multiple cavities and multiple imbedded circuit components.

FIG. 3 shows an alternative embodiment of the present invention having multiple cavities 36 and multiple circuit components 50. A secondary core 26 is shown having a secondary core surface 94. A primary cavity 38 and a secondary cavity 39 are shown. The secondary cavity 39 has a secondary cavity floor surface 91 comprising a portion of the secondary core surface 94. In this embodiment, the secondary core 26 is not in thermal communication with the primary core 20. One circuit component 50 is shown as being deposited at the secondary cavity floor surface 91 of the secondary cavity 39. Suitable material selectable for the secondary core 26 gold, gold alloys, copper, copper alloys, aluminum, aluminum alloys, bronze, metallic-laminate composite materials, carbon fiber laminate, carbon filled laminate and silver-loaded laminate composites, or combinations thereof, metallic-laminate composites, nickel-gold alloys, palladium-silver alloys, carbon ink, silver-loaded ink and other like conductive inks.

Figure 4:
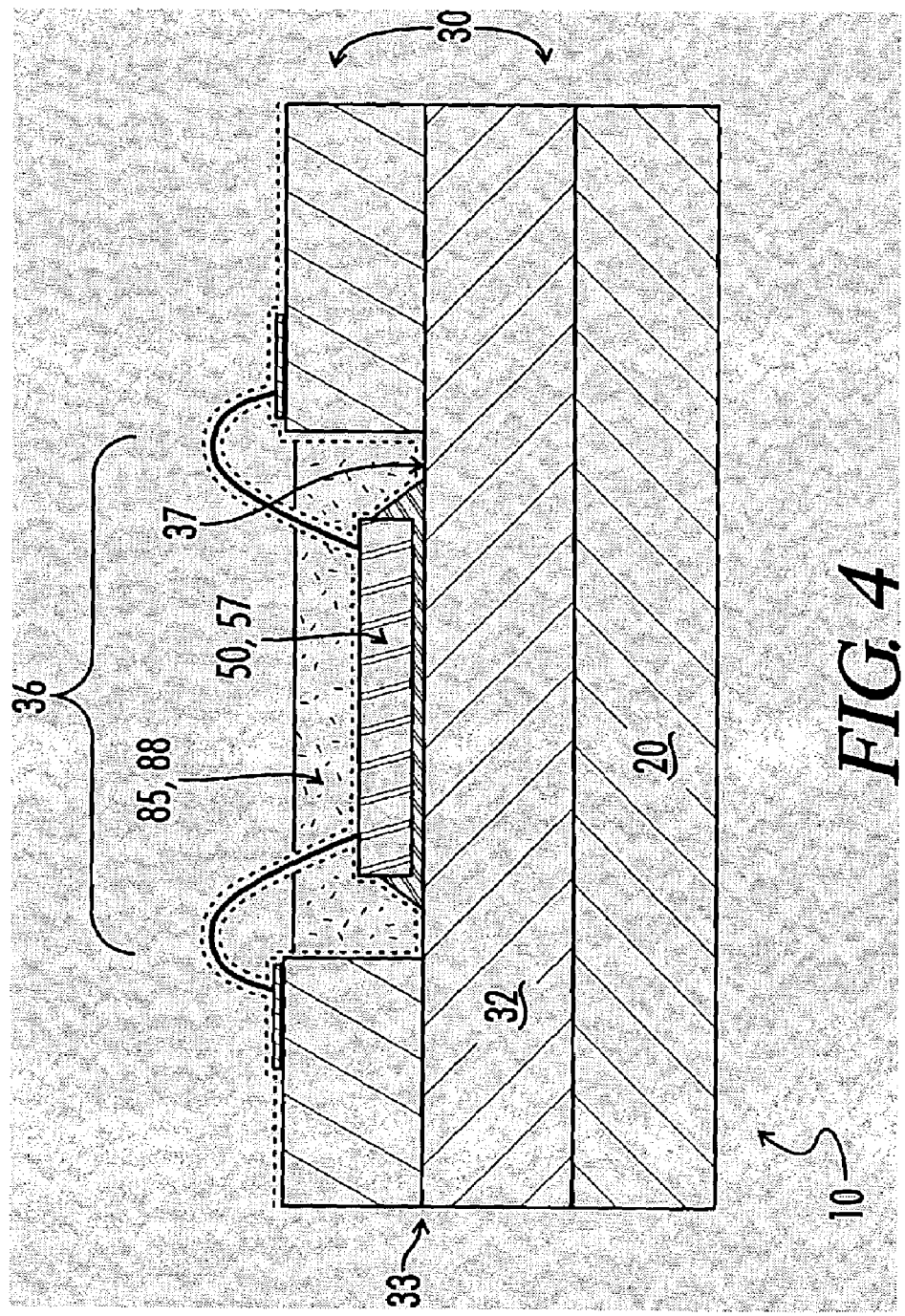
FIG. 4 is a sectioned view of an alternate embodiment of the invention of FIG. 1 having the cavity and imbedded component displaced from the thermal core.

The need for thermal vias and secondary cores to dissipate heat of imbedded components not in direct contact with the primary core is dependent upon the amount of thermal energy produced by the imbedded circuit components 50. Referring now to FIG. 4, an alternative embodiment of the present invention is shown having a passive component 57 imbedded in a cavity 36 and attached to the cavity floor surface 37. The cavity floor surface 37 comprises a portion of the substrate layer top surface 33 of the first substrate layer 32 disposed on the primary core 20. In this embodiment of the invention, a passive component 57, such as a resistor, capacitor, transformer, may be imbedded in a cavity 36 without the need for a secondary core or thermal vias. Thermal energy generated by the passive component 57 is dissipated through an encapsulating material 85. In this embodiment of the invention, the encapsulating material 85 comprises a silicone gel 88, which has thermal conductivity properties that allow it to dissipate heat to the laminate substrate 30 and to the environment.

Figure 5:
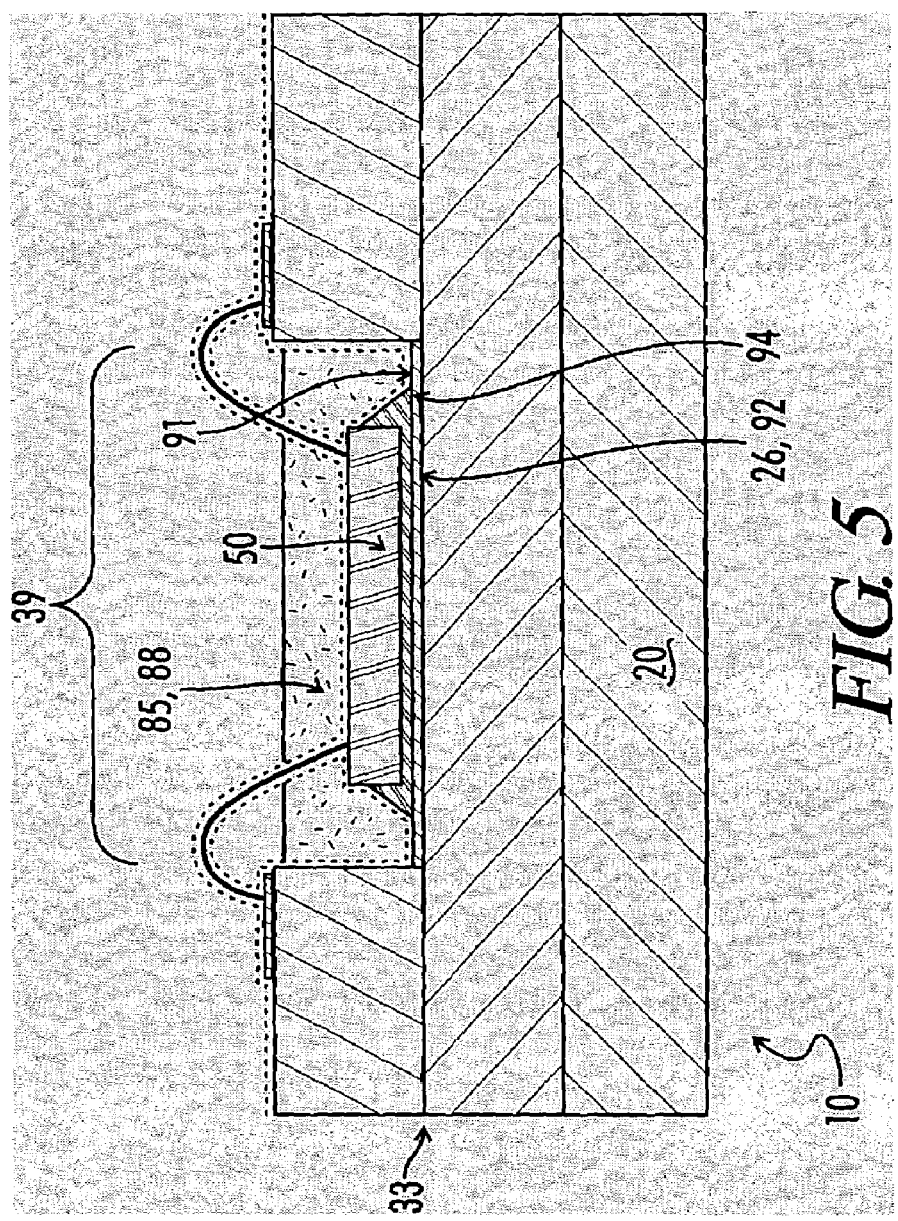
FIG. 5 is a sectioned view of an alternate embodiment of the invention of FIG. 1 having a secondary core comprised of a metal foil.

Referring to FIG. 5, an embodiment of the present invention is shown that is similar to the embodiment shown in FIG. 4. In FIG. 5, a secondary cavity 39 is shown having a secondary cavity floor surface 91 comprising a secondary core 26 not in thermal communication with the primary core 20. In this embodiment, the secondary core 26 comprises a metal foil 92. The metal foil 92 provides additional capacity to dissipate thermal energy generated by the circuit component 50, as compared to the embodiment of FIG. 4.

Figure 6:
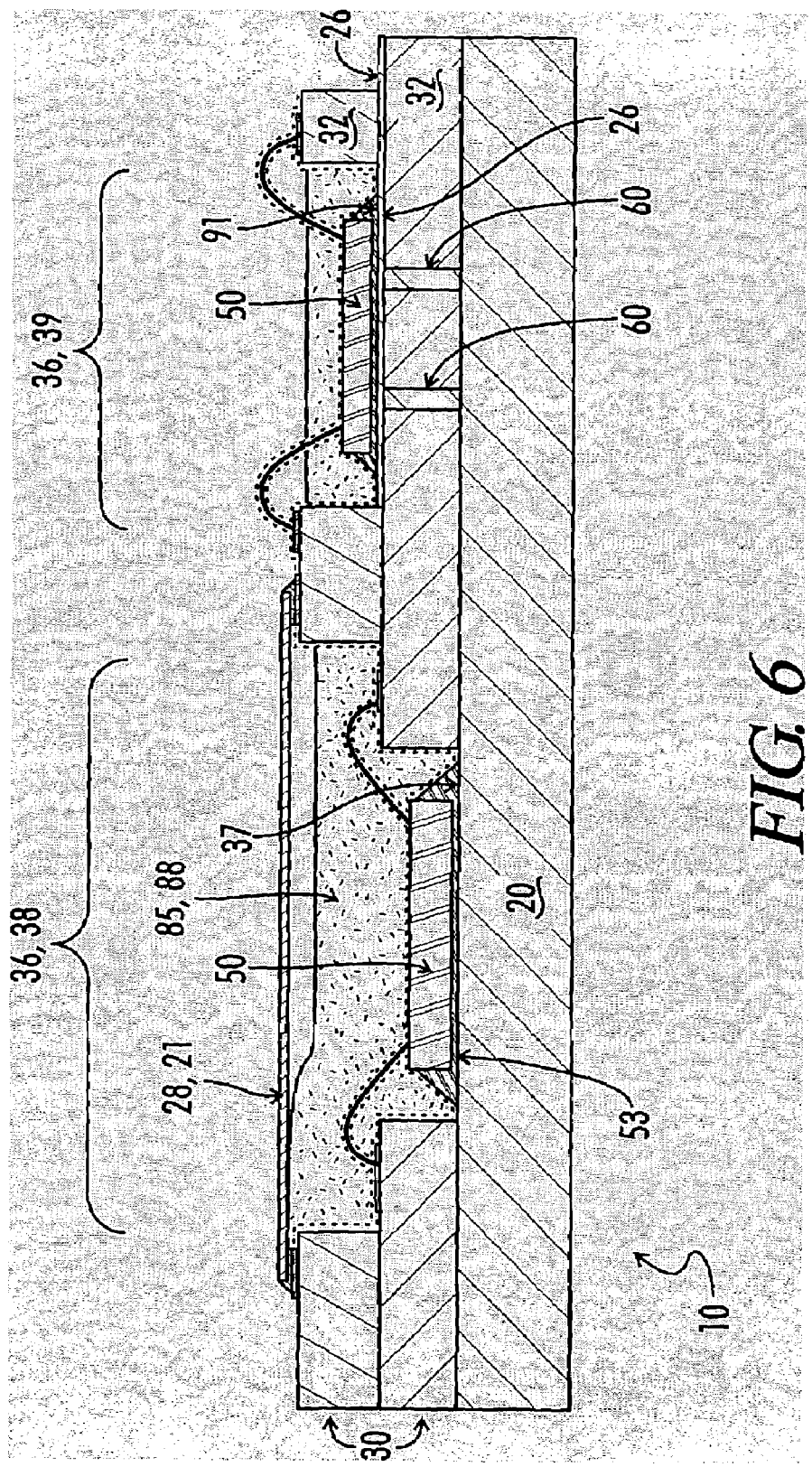
FIG. 6 is a sectioned view of an alternate embodiment of the invention of FIG. 1 having a thermally conductive cavity lid.

Additional thermal management techniques unique to this invention are shown in FIG. 6. The embodiment of the present invention of FIG. 6 is shown having multiple cavities 36 and multiple circuit components 50. A primary cavity 38 and a secondary cavity 39 are shown. The primary cavity 38 is shown having a cavity lid 28 composed of a thermally conductive material 21 selected from the same materials suitable for the primary core 20. The encapsulating material 85 fills the void of the primary cavity 38. In this embodiment of the invention, the encapsulating material 85 comprises a silicone gel 88, which has thermal conductivity properties that allow it to dissipate heat to the laminate substrate 30 and to the environment through the primary cavity lid 28.

Alternate thermal management features of the embodiment are illustrated in FIG. 6. A secondary cavity 39 is shown having secondary cavity floor surface 91 comprising a secondary core 26. In this embodiment, the secondary core 26 extends between the substrate layers 32 and beyond the laminate substrate 30 to form an alternate thermal path to the exterior of the integrated circuit assembly 10. Additionally, this embodiment shows the use of thermal vias 60 to provide thermal communication between the secondary core 26 through the substrate layers 32 to the primary core 20. The novel use of thermally conductive encapsulating material in encapsulating imbedded components combined with the use of a rigid primary core, and optionally, combined with the use of secondary cores, including the cavity lid, allow for greater heat dissipation while achieving high levels of mechanical rigidity and environmental barrier protection.

Figure 7:
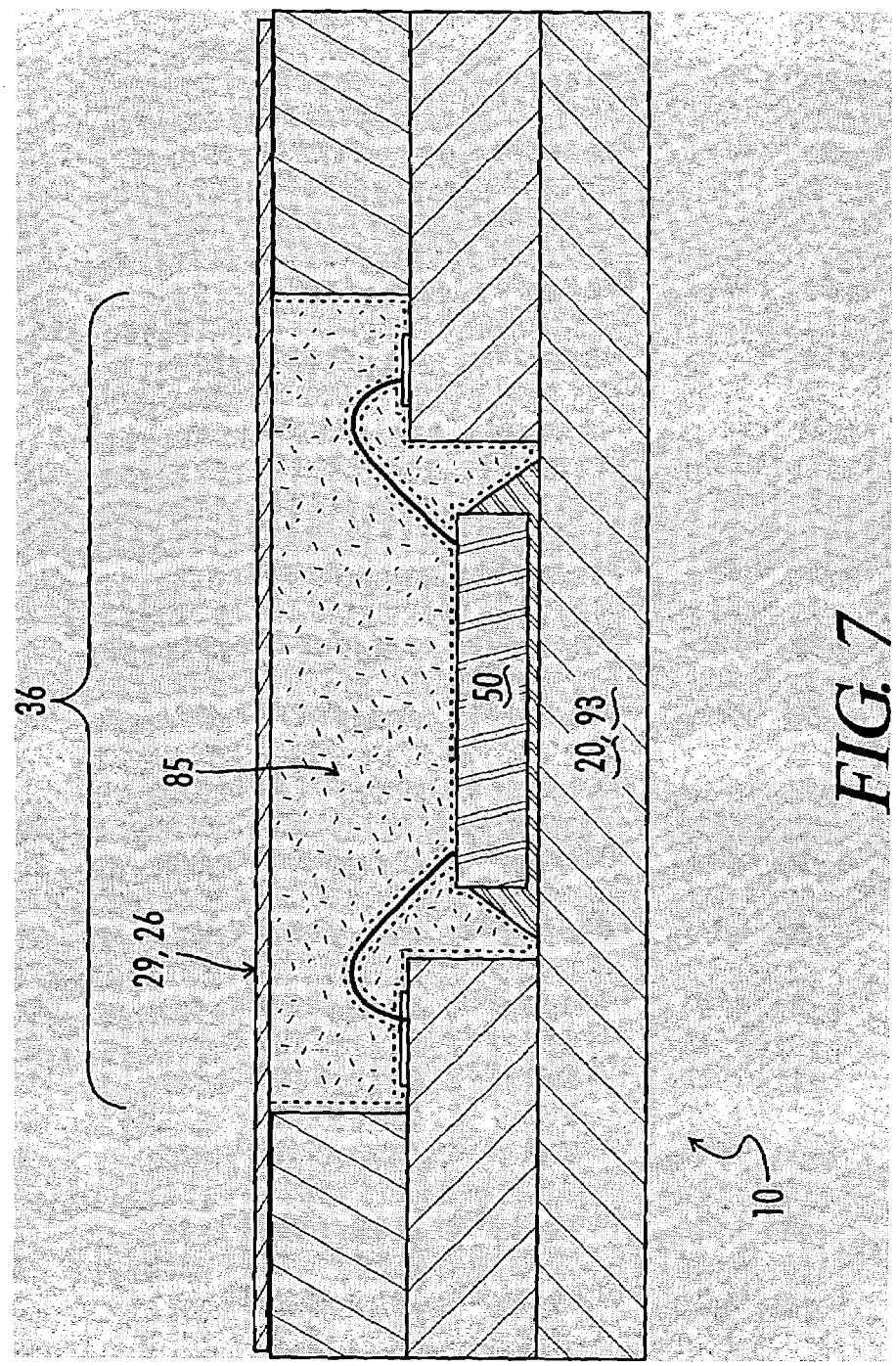
FIG. 7 is a sectioned view of an alternate embodiment of the invention of FIG. 1 having the primary core disposed atop the circuit board assembly.

Referring now to FIG. 7, an alternative embodiment of the present invention is shown having a conventional printed circuit board 93 substituted for the primary core 20 and having a rigid secondary core 26 forming an assembly shield 29 over the integrated circuit assembly 10. The assembly shield 29 comprises a thermally conductive material selected from the same above-identified materials suitable for the primary core 20. FIG. 7 further shows an encapsulated circuit component 50 and a cavity 36. Thermal management is achieved by the encapsulating material 85 conducting heat from the circuit component 50 to the assembly shield 29 for dissipation to the environment.

Figure 8:
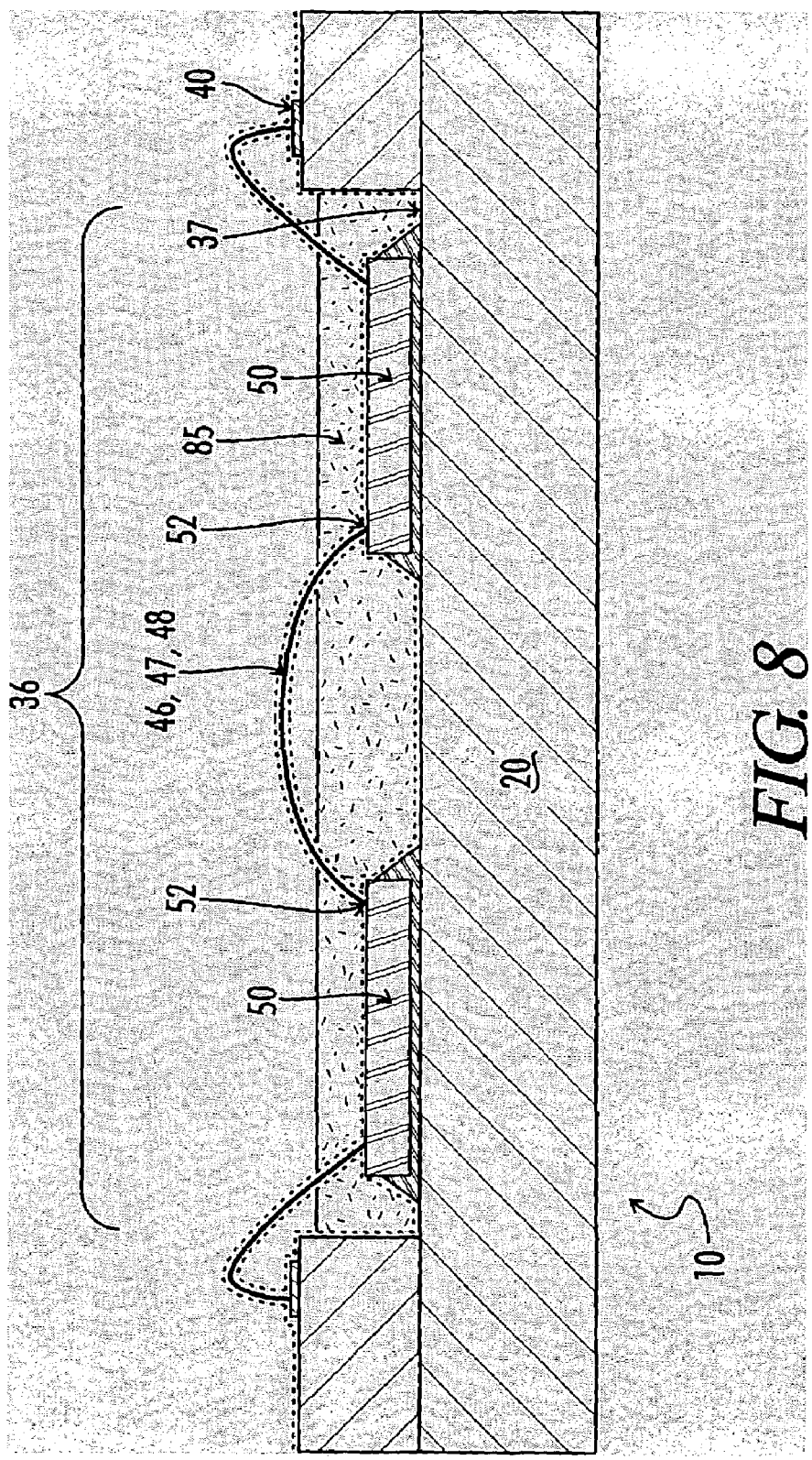
FIG. 8 is a sectioned view of an alternate embodiment of the invention of FIG. 1 having a multiple circuit component deposited in a cavity.

FIG. 8 shows an alternative embodiment of the invention of FIG. 1 having two circuit components 50 disposed on the cavity floor surface 37 of the cavity 36. Both circuit components 50 are coated and encapsulated as described above. This embodiment shows an alternative configuration of the flexible electrical interconnects 46. In this embodiment, a flexible wire bond 47 electrically joins the electrically conductive component bond pad 52 of one circuit component 50 with the electrically conductive bond pad 52 of the second circuit component 50. The embodiment of the present invention shown in FIG. 8 illustrates component to component flexible interconnects 48 as joining circuit components 50 to circuit components 50. In addition flexible wire bonds 47 join each such circuit component 50 with the circuit 40.

Figure 9:
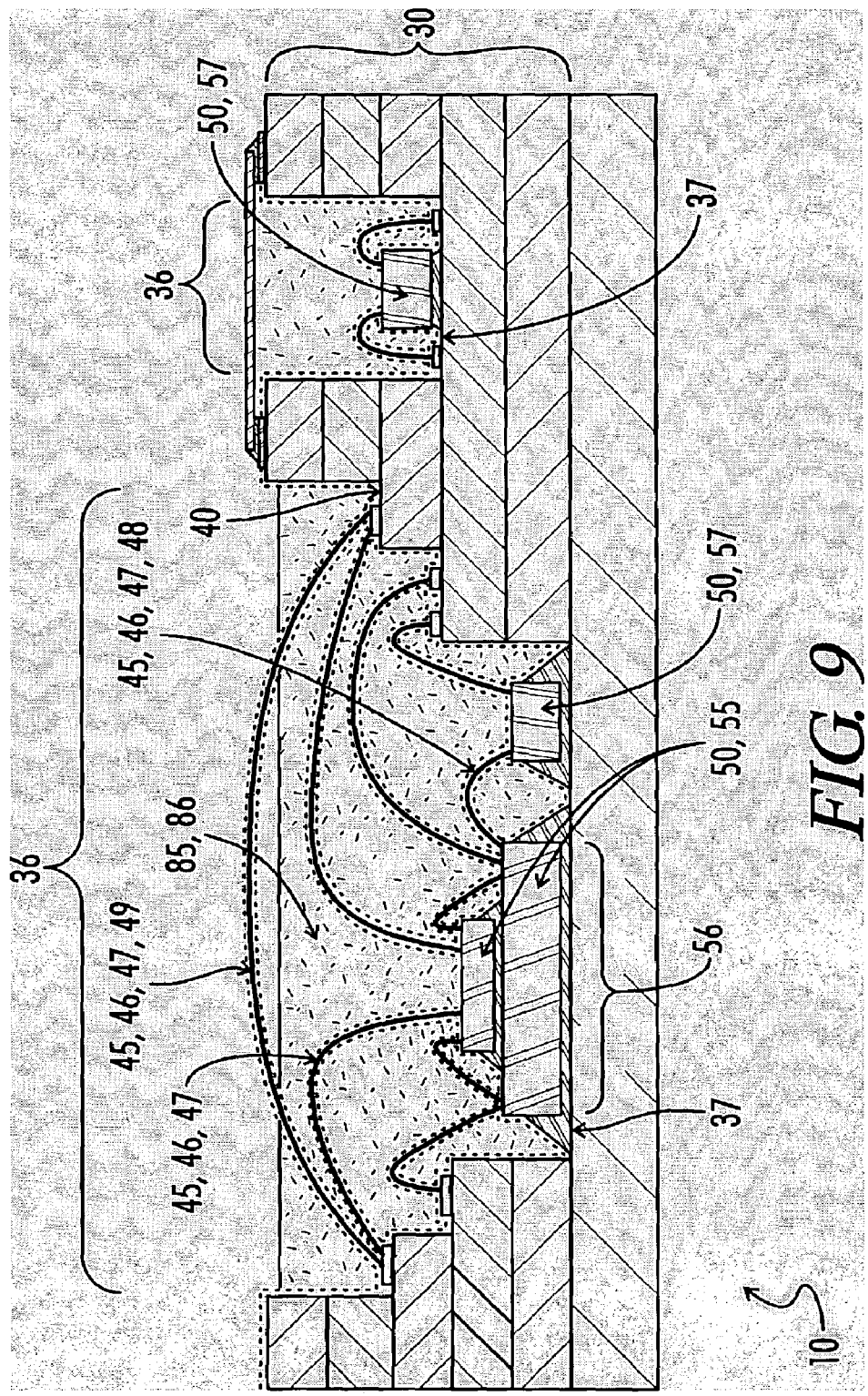
FIG. 9 is a sectioned view of an alternate embodiment of the invention of FIG. 1 having multiple circuit components deposited in multiple cavities.

FIG. 9 shows yet another embodiment of the present invention having multiple circuit components 50 and multiple cavities 36 disposed in the laminate substrate 30. In the central cavity 36, two semiconductor die 55 are shown vertically stacked in a "stacked die" assembly 56. Additionally, a passive component 57 is shown as disposed upon the cavity floor surface 37 of the central cavity 36. The embodiment of the present invention shown in FIG. 9 illustrates component to component flexible interconnects 48 as joining circuit components 50 to circuit components 50. In addition flexible wire bonds 47 join each such circuit component 50 with the circuit 40. A final innovative structure is a circuit to circuit flexible interconnect 49 shown in FIG. 9. The circuit to circuit interconnect 49 is coated and encapsulated in the cavity 36 in a manner similar to the electrical interconnects 45 of FIG. 1 as described above. This feature of the invention allows for the bridging of a cavity 36 disposed within the laminate substrate 30. In the embodiment of FIG. 9, the circuit to circuit flexible interconnect 49 comprises a flexible wire bond 47. Cavity widths of up to 3 inches are bridgeable in this manner. This feature is achieved through use of coating material that increases the structural rigidity of the flexible wire bond 47 and by encapsulating the flexible wire bond 47 in a vibration dampening matrix 86 of encapsulating material 85 to provide increased strength and rigidity.

Figure 10:
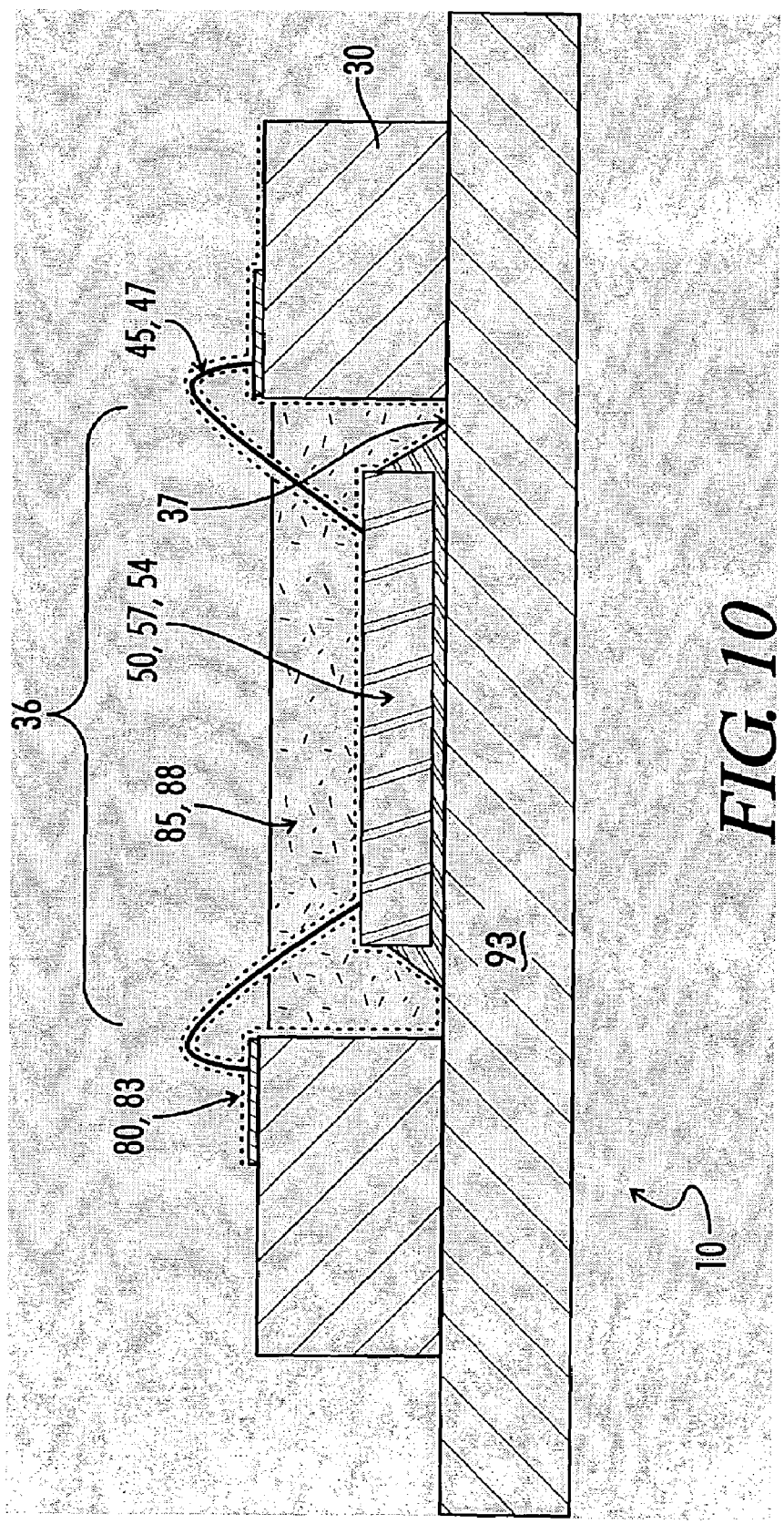
FIG. 10 is a sectioned view of an alternate embodiment of the present invention having a printed circuit board with an imbedded coated and encapsulated circuit component.

FIG. 10 shows yet another alternative embodiment of the invention. FIG. 10 shows an embodiment having a laminate substrate 30 disposed on a conventional printed circuit board 93. A circuit component 50 is deposited upon a cavity floor surface 37 of a cavity 36 disposed within the laminate substrate 30. Wire bonds 47 form the electrical interconnects 45 of this embodiment. Each circuit component 50 has a conformal coating 80 of parylene 83. The cavity 36 is filled with silicone gel 88 forming an encapsulating material 85. This embodiment of the invention does not employ a primary core or secondary core for thermal management. Thermal management is achieved solely through the use of the thermal conductivity of the encapsulating material. This embodiment of the present invention is useful for imbedding, coating and encapsulating typical passive components 57 or low wattage active components 54.

Thus, although there have been described particular embodiments of the present invention of a new and useful Imbedded Component Integrated Circuit Assembly and Method of Making Same, it is not intended that such references be construed as limitations upon the scope of this invention except as set forth in the following claims.

What is claimed is:

1. A printed circuit board assembly, comprising:
    a primary core of thermally conductive material;
    a two-tiered laminate substrate connected to the primary core, the two-tiered laminate substrate including a two-tiered cavity and electrically conductive circuit bonding pads connected to a circuit imbedded in a lower tier of the two-tiered laminate substrate;
    a circuit component disposed within the two-tiered cavity and connected to the primary core using a thermally conductive adhesive material, the circuit component including electrically conductive component bonding pads;
    flexible electrical interconnects connected to the electrically conductive circuit bonding pads and the electrically conductive component bonding pads;
    a conformal coating covering portions of the two-tiered laminate substrate, the thermally conductive adhesive material, the circuit component, the electrically conductive component bonding pads, the flexible electrical interconnects, the electrically conductive circuit bonding pads, and any portions of the primary core located in the two-tiered cavity and not covered by the thermally conductive adhesive material; and
    an encapsulating material filling the two-tiered cavity and encapsulating the thermally conductive adhesive material, the circuit component, the electrically conductive component bonding pads, the flexible electrical interconnects, and the electrically conductive circuit bonding pads.

2. The printed circuit board assembly of claim 1, wherein the circuit component is disposed in a lower tier of the two-tiered cavity.

3. The printed circuit board assembly of claim 1, wherein a portion of the thermally conductive primary core is not connected to and extends outward from the two-tiered laminate substrate.

4. The printed circuit board assembly of claim 1, further comprising a thermally conductive rigid secondary core connected to the two-tiered laminate substrate and covering the two-tiered cavity.

5. The printed circuit board of claim 1, further comprising:
    a single-tiered cavity in the two-tiered laminate substrate;
    a second set of electrically conductive circuit bonding pads connected to a second circuit imbedded in an upper tier of the two-tiered laminate substrate;
    a secondary core of thermally conductive material disposed within the single-tiered cavity and connected to a lower tier of the two-tiered laminate substrate;
    a second circuit component disposed within the single-tiered cavity and connected to the secondary core using a second thermally conductive adhesive material, the second circuit component including a second set of electrically conductive component bonding pads;
    a second set of flexible electrical interconnects connected to the second set of electrically conductive circuit bonding pads and the second set of electrically conductive component bonding pads;
    the conformal coating covering the second set of flexible electrical interconnects, portions of the two-tiered laminate substrate forming the single-tiered cavity and not covered by the secondary core, the second circuit component, the second thermally conductive adhesive material, and any portions of the secondary core that are not covered by the second thermally conductive adhesive material; and
    the encapsulating material filling the single-tiered cavity and encapsulating the second circuit component, the second thermally conductive adhesive material, the secondary core, and portions of the second set of flexible electrical interconnects.

6. The printed circuit board assembly of claim 5, wherein the primary core and the secondary core are not in thermal communication.

7. The printed circuit board assembly of claim 5, wherein:
    the two-tiered cavity is covered by a thermally conductive cavity lid;
    the lower tier of the two-tiered laminate substrate includes thermal vias forming thermal paths from the single-tiered cavity to the thermally conductive primary core; and
    a portion of the thermally conductive secondary core is not covered by the upper tier of the two-tiered laminate substrate.

8. A printed circuit board assembly, comprising:
    a thermally conductive primary core;
    a two-tiered laminate substrate connected to the primary core, the laminate substrate including a single-tiered cavity and electrically conductive circuit bonding pads connected to a circuit imbedded in an upper tier of the two-tiered laminate substrate;
    a circuit component disposed within the single-tiered cavity of the two-tiered laminate substrate and connected to a lower tier of the two-tiered laminate substrate using thermally conductive adhesive material, the circuit component including electrically conductive component bonding pads;

flexible electrical interconnects connected to the electrically conductive circuit bonding pads and the electrically conductive component bonding pads;

a conformal coating covering portions of the upper tier of the two-tiered laminate substrate, the electrically conductive circuit bonding pads, the flexible electrical interconnects, the electrically conductive component bonding pads, the circuit component, the thermally conductive adhesive material, and any portions of the two-tiered laminate substrate located in the single-tiered cavity and not covered by the thermally conductive material; and an encapsulating material filling the single-tiered cavity and encapsulating the circuit component, the thermally conductive adhesive material, the electrically conductive component bonding pads, and portions of the flexible electrical interconnects.

9. The printed circuit board of claim 8, wherein the two-tiered laminate substrate further includes thermal vias located in the lower tier of the two-tiered laminate substrate and forming thermal paths from the single-tiered cavity to the thermally conductive primary core.

10. The printed circuit board of claim 8, wherein:

the circuit component is connected to the lower tier of the two-tiered laminate substrate using the thermally conductive adhesive material and a thermally conductive secondary core disposed in the single-tiered cavity, the thermally conductive secondary core not being in thermal communication with the thermally conductive primary core; and the conformal coating covers portions of the thermally conductive secondary core not covered by the thermally conductive adhesive material.

11. A printed circuit board assembly, comprising:

a primary core of thermally conductive material;

a laminate substrate connected to the primary core, the laminate substrate including a cavity and electrically conductive circuit bonding pads connected to a circuit imbedded in the laminate substrate;

a circuit component disposed within the cavity of the laminate substrate and connected to the primary core using a thermally conductive adhesive material, the circuit component including electrically conductive component bonding pads;

flexible electrical interconnects connected to the electrically conductive circuit bonding pads and the electrically conductive component bonding pads;

a conformal coating covering the electrical interconnects, the laminate substrate, and any portions of the primary core that are not connected to the laminate substrate or the circuit component; and an encapsulating material encapsulating the circuit component and the electrical interconnects, wherein the printed circuit board assembly does not comprise a semiconductor package.

12. A printed circuit board assembly, comprising:

a primary core of thermally conductive material;

a laminate substrate connected to the primary core, the laminate substrate including a cavity and electrically conductive circuit bonding pads connected to a circuit imbedded in the laminate substrate;

a circuit component disposed within the cavity of the laminate substrate and connected to the primary core using a thermally conductive adhesive material, the circuit component including electrically conductive component bonding pads;

flexible electrical interconnects connected to the electrically conductive circuit bonding pads and the electrically conductive component bonding pads;

a conformal coating covering the electrical interconnects, the laminate substrate, and any portions of the primary core that are not connected to the laminate substrate or the circuit component; and an encapsulating material encapsulating the circuit component and the electrical interconnects, wherein the printed circuit board assembly does not comprise a packaged semiconductor chip.

13. A printed circuit board assembly, comprising:

a primary core of thermally conductive material;

a laminate substrate connected to the primary core, the laminate substrate including a cavity and electrically conductive circuit bonding pads connected to a circuit imbedded in the laminate substrate;

a circuit component disposed within the cavity of the laminate substrate and connected to the primary core using a thermally conductive adhesive material, the circuit component including electrically conductive component bonding pads;

flexible electrical interconnects connected to the electrically conductive circuit bonding pads and the electrically conductive component bonding pads;

a conformal coating covering the electrical interconnects, the laminate substrate, and any portions of the primary core that are not connected to the laminate substrate or the circuit component; and an encapsulating material encapsulating the circuit component and the electrical interconnects, a second circuit component disposed within the cavity of the laminate substrate and connected to the primary core using a second thermally conductive adhesive material, the second circuit component including a second set of electrically conductive component bonding pads;

a second set of electrical interconnects connecting the second set of electrically conductive component bonding pads located on the second circuit component with the electrically conductive component bonding pads located on the first circuit component and or the electrically conductive circuit bonding pads located on the laminate substrate;

the conformal coating covering the first and second set of electrical interconnects, the second circuit component, the second thermally conductive adhesive material, and any portions of the primary core that are not covered by the second thermally conductive adhesive material; and the encapsulating material encapsulating the second circuit component, the second thermally conductive adhesive material, and a portion of the second set of electrical interconnects.

14. A printed circuit board assembly, comprising:

a primary core of thermally conductive material;

a laminate substrate connected to the primary core, the laminate substrate including a cavity and electrically conductive circuit bonding pads connected to a circuit imbedded in the laminate substrate;

a circuit component disposed within the cavity of the laminate substrate and connected to the primary core using a thermally conductive adhesive material, the circuit component including electrically conductive component bonding pads;

flexible electrical interconnects connected to the electrically conductive circuit bonding pads and the electrically conductive component bonding pads;

a conformal coating covering the electrical interconnects, the laminate substrate, and any portions of the primary core that are not connected to the laminate substrate or the circuit component; and an encapsulating material encapsulating the circuit component and the electrical interconnects, a second circuit component disposed within the cavity of the laminate substrate and connected to the first circuit component using a second thermally conductive adhesive material, the second circuit component including a second set of electrically conductive component bonding pads;

a second set of electrical interconnects connecting the second set of electrically conductive component bonding pads located on the second circuit component with the electrically conductive component bonding pads located on the first circuit component and or the electrically conductive circuit bonding pads located on the laminate substrate;

a third circuit component disposed within the cavity of the laminate substrate and connected to the primary core using a third thermally conductive adhesive material, the third circuit component including a third set of electrically conductive component bonding pads;

a third set of electrical interconnects connecting the third set of electrically conductive component bonding pads located on the third circuit component with the electrically conductive component bonding pads located on the first circuit component and or the electrically conductive circuit bonding pads located on the laminate substrate;

a fourth circuit component disposed within a second cavity located in the laminate substrate and connected to the laminate substrate using a fourth thermally conductive adhesive material, the fourth circuit component including a fourth set of electrically conductive component bonding pads;

a fourth set of electrical interconnects connecting the fourth set of electrically conductive component bonding pads located on the fourth circuit component with the electrically conductive circuit bonding pads located on the laminate substrate;

the conformal coating covering the first and second set of electrical interconnects, the second, third, and fourth circuit components, the second, third, and fourth thermally conductive adhesive materials, and any portions of the primary core and laminate substrate that are not covered by the second, third, and fourth thermally conductive adhesive materials; and the encapsulating material encapsulating the second, third, and fourth circuit components, the second, third, and fourth thermally conductive adhesive materials, and the second, third, and fourth sets of electrical interconnects;

a thermally conductive secondary core connected to the laminate substrate and covering the second cavity.

15. A printed circuit board assembly, comprising:

a thermally conductive primary core;

a laminate substrate connected to the primary core, the laminate substrate including a cavity and electrically conductive circuit bonding pads connected to a circuit imbedded in the laminate substrate;

a thermally conductive secondary core disposed in the cavity and connected to the laminate substrate;

a circuit component disposed within the cavity of the laminate substrate and connected to the thermally conductive secondary core using thermally conductive adhesive material, the circuit component including electrically conductive component bonding pads;

electrical interconnects connected to the electrically conductive circuit bonding pads and the electrically conductive component bonding pads;

a conformal coating covering the electrical interconnects, the circuit component, the thermally adhesive material, the laminate substrate, and any portions of the thermally conductive secondary core that are not covered by the thermally conductive material; and an encapsulating material filling the cavity and encapsulating the circuit component, the thermally conductive adhesive material, the thermally conductive secondary core, and a portion of the electrical interconnects, wherein a portion of the thermally conductive secondary core is not connected to and extends out from the laminate substrate.

16. A printed circuit board assembly, comprising:

a conventional printed circuit board;

a laminate substrate connected to the conventional printed circuit board, the laminate substrate including a cavity and electrically conductive circuit bonding pads connected to a circuit imbedded in the laminate substrate;

a circuit component disposed within the cavity of the laminate substrate and connected to the conventional printed circuit board using a thermally conductive adhesive material, the circuit component including electrically conductive component bonding pads;

electrical interconnects connected to the electrically conductive circuit bonding pads and the electrically conductive component bonding pads;

a conformal coating covering the electrical interconnects, the laminate substrate, and any portions of the conventional printed circuit board that are not connected to the laminate substrate or the circuit component; and an encapsulating material filling the cavity and encapsulating the thermally conductive adhesive material, the circuit component, the electrically conductive circuit bonding pads, the electrically conductive component bonding pads and the electrical interconnects.

17. The printed circuit board assembly of claim 16, further comprising a thermally conductive rigid secondary core connected to the laminate substrate and covering the cavity.

* * * * *